(12) United States Patent
Asai (10) Patent No.: US 10,658,273 B2
(45) Date of Patent: May 19, 2020

(54) SEMICONDUCTOR DEVICE AND MANUFACTURING METHOD THEREOF

(71) Applicant: Denso Corporation, Kariya, Aichi-pref (JP)

(72) Inventor: Rintaro Asai, Nisshin (JP)

(73) Assignee: Denso Corporation, Kariya, Aichi-pref (JP)

(*) Notice: Subject to any disclaimer, the term of this patent is extended or adjusted under 35 U.S.C. 154(b) by 0 days.

(21) Appl. No.: 16/173,187

(22) Filed: Oct. 29, 2018

(65) Prior Publication Data

US 2019/0131217 A1 May 2, 2019

(30) Foreign Application Priority Data

Oct. 31, 2017 (JP) .................................. 2017-211335

(51) Int. Cl.

| H01L 23/495 | (2006.01) |
| H01L 25/07 | (2006.01) |
| H01L 23/31 | (2006.01) |
| H01L 23/00 | (2006.01) |
| H01L 23/373 | (2006.01) |
| H01L 23/433 | (2006.01) |

(52) U.S. Cl.
CPC .... *H01L 23/49562* (2013.01); *H01L 23/3121* (2013.01); *H01L 23/3142* (2013.01); *H01L 23/3735* (2013.01); *H01L 23/4334* (2013.01); *H01L 23/49568* (2013.01); *H01L 23/49575* (2013.01); *H01L 24/33* (2013.01); *H01L 25/072* (2013.01); *H01L 2224/33* (2013.01); *H01L 2224/33181* (2013.01); *H01L 2924/1033* (2013.01); *H01L 2924/10253* (2013.01); *H01L 2924/10272* (2013.01); *H01L 2924/13055* (2013.01); *H01L 2924/13091* (2013.01); *H01L 2924/181* (2013.01)

(58) Field of Classification Search
CPC .......................... H01L 23/3142; H01L 23/3121
See application file for complete search history.

(56) References Cited

U.S. PATENT DOCUMENTS

2016/0218047 A1    7/2016  Okumura et al.
2016/0233202 A1*   8/2016  Komo .................... H01L 23/00

FOREIGN PATENT DOCUMENTS

JP         2015-057807 A        3/2015

OTHER PUBLICATIONS

SYSTEMPlus Consulting, Infineon FF400R07A01E3, (2018).

* cited by examiner

*Primary Examiner* — Samuel A Gebremariam
(74) *Attorney, Agent, or Firm* — Dinsmore & Shohl LLP (57) ABSTRACT

A semiconductor device may include: a first and a second semiconductor elements; and a first and a second insulated substrates each including an insulator layer and a metal layer disposed on each of two faces of the insulator layer, the metal layers respectively on one face of the first and the second insulated substrate being connected to the first and the second semiconductor element, wherein the metal layers respectively on the one face of the first and the second insulated substrate are electrically connected via a joint each other; the joint is constituted of a separate member from the insulated substrates; and one end of the joint is connected to the metal layer on the one face of the first insulated substrate, and another end of the joint is connected to the metal layer on the one face of the second insulated substrate.

16 Claims, 5 Drawing Sheets

SEMICONDUCTOR DEVICE AND MANUFACTURING METHOD THEREOF

CROSS-REFERENCE

This application claims priority to Japanese patent application No. 2017-211335, filed on Oct. 31, 2017, contents of which are incorporated herein by reference.

TECHNICAL FIELD

The technology disclosed herein relates to a semiconductor device and a manufacturing method thereof.

BACKGROUND

Japanese Patent Application Publication No. 2015-57807 discloses a semiconductor device. This semiconductor device includes a first semiconductor element and a second semiconductor element, a first metal member connected to the first semiconductor element, and a second metal member connected to the second semiconductor element. The first metal member in this semiconductor device is electrically connected to the second metal member via a joint. This joint is disposed integrally with at least one of the first and second metal members.

SUMMARY

According to a configuration of the semiconductor device above, assembly can be performed, in a manufacturing step, with high positioning accuracy between the joint and another member. On the other hand, a type of such a semiconductor device may adopt an insulated substrate instead of a metal member. Here, the insulated substrate is a substrate mainly used for a power-system circuit, and includes an insulator layer constituted of, for example, ceramic, and a metal layer constituted of copper, aluminum, or the like disposed on each of two faces of the insulator layer. If the insulated substrate is adopted, it is conceivable that the metal layer to be connected to the semiconductor element has a joint provided in advance integrally therewith. However, when the insulated substrate is manufactured, bonding the metal layer to the insulator layer requires high-temperature treatment. If the metal layer has a joint provided in advance thereat, the joint may be softened and deformed owing to high temperatures. If such a joint is used to manufacture the semiconductor device, two insulated substrates cannot be connected at a correct position or in a correct orientation. The present specification provides a technology for preventing deformation of a joint in manufacturing a semiconductor device that includes an insulated substrate having the joint.

A semiconductor device disclosed herein may comprise: a first semiconductor element and a second semiconductor element; a first insulated substrate comprising an insulator layer and a metal layer disposed on each of two faces of the insulator layer, the metal layer on one face of the first insulated substrate being connected to the first semiconductor element; and a second insulated substrate comprising an insulator layer and a metal layer disposed on each of two faces of the insulator layer, the metal layer on one face of the second insulated substrate being connected to the second semiconductor element, wherein the metal layer on the one face of the first insulated substrate is electrically connected to the metal layer on the one face of the second insulated substrate via a joint; the joint is constituted of a separate member from the first insulated substrate and the second insulated substrate; and one end of the joint is connected to the metal layer on the one face of the first insulated substrate, and another end of the joint is connected to the metal layer on the one face of the second insulated substrate.

DETAILED DESCRIPTION

In an embodiment of the present technology, a semiconductor device may comprise: a first semiconductor element and a second semiconductor element; a first insulated substrate comprising an insulator layer and a metal layer disposed on each of two faces of the insulator layer, the metal layer on one face of the first insulated substrate being connected to the first semiconductor element; and a second insulated substrate comprising an insulator layer and a metal layer disposed on each of two faces of the insulator layer, the metal layer on one face of the second insulated substrate being connected to the second semiconductor element, wherein the metal layer on the one face of the first insulated substrate is electrically connected to the metal layer on the one face of the second insulated substrate via a joint; the joint is constituted of a separate member from the first insulated substrate and the second insulated substrate; and one end of the joint is connected to the metal layer on the one face of the first insulated substrate, and another end of the joint is connected to the metal layer on the one face of the second insulated substrate.

In the semiconductor device above, the joint is constituted of the separate member from the first insulated substrate and the second insulated substrate. One end of the joint is connected to the metal layer on the one face of the first insulated substrate, and the other end of the joint is connected to the metal layer on the one face of the second insulated substrate. According to such a configuration, when the semiconductor device is manufactured, a joint does not need to be disposed in advance at the first and second insulated substrates, and the joint can be prepared individually as the separate member from the first and second insulated substrates. In a process of preparing the first and second insulated substrates, the joint is thereby not influenced by high-temperature treatment, so that deformation of the joint can be prevented.

The present disclosure discloses a method of manufacturing the semiconductor device above. This manufacturing method may include preparing the first insulated substrate, the second insulated substrate, and the joint respectively, and bonding the one end of the joint to the metal layer on the one face of the first insulated substrate, and bonding the other end of the joint to the metal layer on the one face of the second insulated substrate. According to such a configuration, in the process of preparing the first and second insulated substrates, the joint is not influenced by high-temperature treatment, so that deformation of the joint can be prevented.

In an embodiment of the present technology, a recess part may be provided in the metal layer on the one face of at least one of the first insulated substrate and the second insulated substrate, and the one or the other end of the joint may be connected to the recess part. According to such a configuration, when the semiconductor device is manufactured, the joint can be bonded with high positional accuracy to at least one of the first and second insulated substrates. At this occasion, the recess part may be provided to have a depth corresponding to a part of a thickness of the metal layer, or may be provided to have a depth corresponding to the entire thickness of the metal layer and reach the insulator layer.

In an embodiment of the present technology, at least a part of the metal layer on the one face of the first insulated substrate may be opposed to at least a part of the metal layer on the one face of the second insulated substrate. According to such a configuration, the joint can be connected vertically between the metal layer on the one face of the first insulated substrate and the metal layer on the one face of the second insulated substrate, so that the joint can be bonded easily to the first and second insulated substrates.

Representative, non-limiting examples of the present disclosure will now be described in further detail with reference to the attached drawings. This detailed description is merely intended to teach a person of skill in the art further details for practicing aspects of the present teachings and is not intended to limit the scope of the disclosure. Furthermore, each of the additional features and teachings disclosed below may be utilized separately or in conjunction with other features and teachings to provide improved semiconductor devices and manufacturing method thereof, as well as methods for using and manufacturing the same.

Moreover, combinations of features and steps disclosed in the following detailed description may not be necessary to practice the disclosure in the broadest sense, and are instead taught merely to particularly describe representative examples of the disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENTS

First Embodiment

Figure 1:
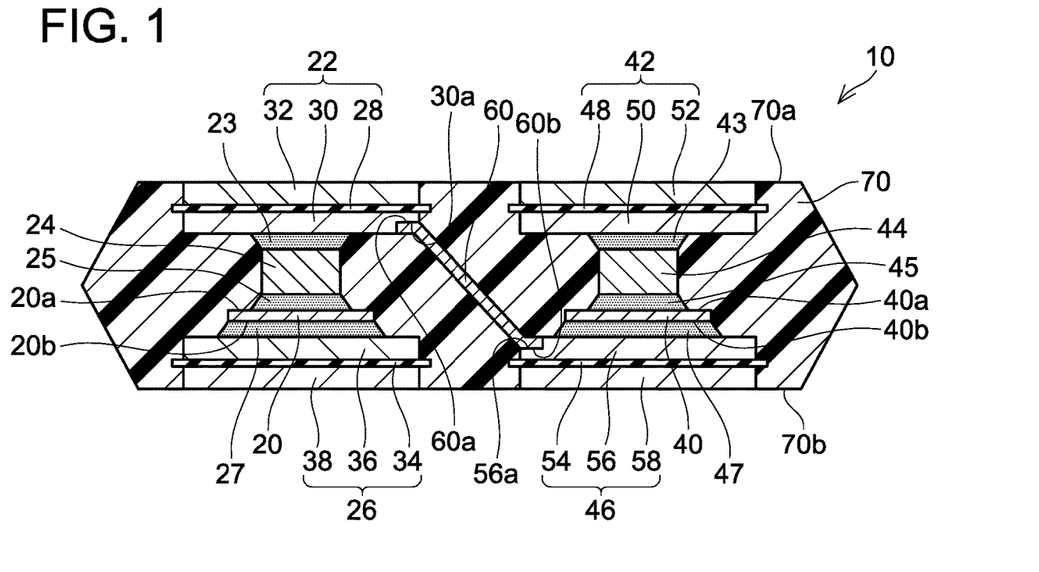
FIG. 1 is a cross-sectional view illustrating an internal structure of a semiconductor device 10 in a first embodiment.

A semiconductor device 10 in a first embodiment will be described with reference to the drawings. As illustrated in FIG. 1, the semiconductor device 10 includes a first semiconductor element 20, a second semiconductor element 40, and a sealant 70. The first semiconductor element 20 and the second semiconductor element 40 are sealed within the sealant 70. The sealant 70 is constituted of, for example, a thermosetting resin such as an epoxy resin, but is not particularly limited thereto. Each of the first semiconductor element 20 and the second semiconductor element 40 is, for example, a MOSFET (Metal-Oxide-Semiconductor Field-Effect Transistor) or an IGBT (Insulated Gate Bipolar Transistor), but its specific type or structure is not particularly limited thereto. A material used for the first semiconductor element 20 and the second semiconductor element 40 may be, for example, silicon (Si), silicon carbide (SiC), or nitride semiconductor such as gallium nitride (GaN), but is not particularly limited thereto.

The first semiconductor element 20 has an upper electrode 20$a$ and a lower electrode 20$b$. The upper electrode 20$a$ is positioned on an upper surface of the first semiconductor element 20, and the lower electrode 20$b$ is positioned on a lower surface of the first semiconductor element 20. Similarly, the second semiconductor element 40 has an upper electrode 40$a$ and a lower electrode 40$b$. The upper electrode 40$a$ is positioned on an upper surface of the second semiconductor element 40, and the lower electrode 40$b$ is positioned on a lower surface of the second semiconductor element 40. A material that constitutes the upper electrodes 20$a$, 40$a$ and the lower electrodes 20$b$, 40$b$ of the first semiconductor element 20 and the second semiconductor element 40 is not particularly limited either, and aluminum-based metal or another metal, for example, can be adopted.

The semiconductor device 10 further includes a first upper insulated substrate 22, a first conductor spacer 24, and a first lower insulated substrate 26. The first upper insulated substrate 22 includes an insulator layer 28, an inner metal layer 30 disposed on one face of the insulator layer 28, and an outer metal layer 32 disposed on the other face of the insulator layer 28. The inner metal layer 30 and the outer metal layer 32 are insulated from each other by the insulator layer 28. The inner metal layer 30 of the first upper insulated substrate 22 is electrically connected to the upper electrode 20$a$ of the first semiconductor element 20 via the first conductor spacer 24. The present embodiment adopts soldering for this connection, but is not particularly limited thereto, and solder layers 23, 25 are provided between the first upper insulated substrate 22 and the first conductor spacer 24, and between the first conductor spacer 24 and the first semiconductor element 20, respectively. Furthermore, a recess part 30$a$ is provided in the inner metal layer 30 of the first upper insulated substrate 22. A bonding part 60$a$ of a joint 60 is bonded to the recess part 30$a$ by soldering, as to be mentioned below.

As an example, the first upper insulated substrate 22 in the present embodiment is a DBC (Direct Bonded Copper) substrate. The insulator layer 28 is constituted of ceramic such as aluminum oxide, silicon nitride, aluminum nitride, or the like, and each of the inner metal layer 30 and the outer metal layer 32 is constituted of copper. Notably, the first upper insulated substrate 22 is not limited to the DBC substrate, and may be a DBA (Direct Bonded Aluminum) substrate, which includes the insulator layer 28 and high purity aluminum bonded to each of the two faces of the insulator layer 28. A material that constitutes the insulator layer 28 is not limited to ceramic, and may be other insulators. A material that constitutes the inner metal layer 30 and the outer metal layer 32 is not limited to copper or aluminum, and may be other metals. A bonding structure between the insulator layer 28 and each of the metal layers 30, 32 is not particularly limited either. Moreover, the first conductor spacer 24 in the present embodiment is constituted of, for example, a conductor such as copper and other metals.

The first lower insulated substrate 26 includes an insulator layer 34, an inner metal layer 36 disposed on one face of the insulator layer 34, and an outer metal layer 38 disposed on the other face of the insulator layer 34. The inner metal layer 36 and the outer metal layer 38 are insulated from each other by the insulator layer 34. The inner metal layer 36 of the first lower insulated substrate 26 is electrically connected to the lower electrode 20b of the first semiconductor element 20. The present embodiment adopts soldering for this connection, but is not particularly limited thereto, and a solder layer 27 is provided between the first semiconductor element 20 and the first lower insulated substrate 26.

As an example, the first lower insulated substrate 26 in the present embodiment is a DBC substrate. The insulator layer 34 is constituted of, for example, ceramic such as aluminum oxide, silicon nitride, aluminum nitride and the like, and each of the inner metal layer 36 and the outer metal layer 38 is constituted of copper. It should be noted that the first lower insulated substrate 26 is not limited to the DBC substrate, and may be a DBA substrate, which includes the insulator layer 34 and high purity aluminum bonded to each of the two faces of the insulator layer 34. A material that constitutes the insulator layer 34 is not limited to ceramic, and may be other insulators. A material that constitutes the inner metal layer 36 and the outer metal layer 38 is not limited to copper or aluminum, and may be another metal. A bonding structure between the insulator layer 34 and each of the metal layers 36, 38 is not particularly limited either. It should be noted that the first lower insulated substrate 26 may have a configuration similar to or different from that of the first upper insulated substrate 22.

The outer metal layer 32 of the first upper insulated substrate 22 is exposed at an upper surface 70a of the sealant 70. The first upper insulated substrate 22 thereby constitutes a part of an electric circuit of the semiconductor device 10, and additionally, functions as a heat sink that mainly dissipates heat in the first semiconductor element 20 to an outside. Similarly, the outer metal layer 38 of the first lower insulated substrate 26 is exposed at a lower surface 70b of the sealant 70. The first lower insulated substrate 26 thereby also constitutes a part of the electric circuit of the semiconductor device 10, and additionally, functions as a heat sink that mainly dissipates heat in the first semiconductor element 20 to an outside. As such, the semiconductor device 10 in the present embodiment has a double-side cooling structure in which the outer metal layers 32, 38 are exposed at both of the upper and lower surfaces 70a, 70b of the sealant 70, respectively.

The semiconductor device 10 further includes a second upper insulated substrate 42, a second conductor spacer 44, and a second lower insulated substrate 46. The second upper insulated substrate 42 includes an insulator layer 48, an inner metal layer 50 disposed on one face of the insulator layer 48, and an outer metal layer 52 disposed on the other face of the insulator layer 48. The inner metal layer 50 and the outer metal layer 52 are insulated from each other by the insulator layer 48. The inner metal layer 50 of the second upper insulated substrate 42 is electrically connected to the upper electrode 40a of the second semiconductor element 40 via the second conductor spacer 44. The present embodiment adopts soldering for this connection, but is not particularly limited thereto, and solder layers 43, 45 are provided between the second upper insulated substrate 42 and the second conductor spacer 44, and between the second conductor spacer 44 and the second semiconductor element 40, respectively.

As an example, the second upper insulated substrate 42 in the present embodiment is a DBC substrate. It should be noted that, as in the first upper insulated substrate 22 mentioned above, a specific configuration of the second upper insulated substrate 42 is not particularly limited. Various materials can be adopted for an insulator that constitutes the insulator layer 48, and for metal that constitutes each of the metal layers 50, 52. A bonding structure between the insulator layer 48 and each of the metal layers 50, 52 is not particularly limited either. Moreover, the second conductor spacer 44 in the present embodiment is constituted of, for example, a conductor such as copper and other metals.

The second lower insulated substrate 46 includes an insulator layer 54, an inner metal layer 56 disposed on one face of the insulator layer 54, and an outer metal layer 58 disposed on the other face of the insulator layer 54. The inner metal layer 56 and the outer metal layer 58 are insulated from each other by the insulator layer 54. The inner metal layer 56 of the second lower insulated substrate 46 is electrically connected to the lower electrode 40b of the second semiconductor element 40. The present embodiment adopts soldering for this connection, but is not particularly limited thereto, and a solder layer 47 is provided between the second semiconductor element 40 and the second lower insulated substrate 46. Furthermore, a recess part 56a is provided in the inner metal layer 56 of the second lower insulated substrate 46. A bonding part 60b of the joint 60 is bonded to the recess part 56a by soldering, as mentioned below.

As an example, the second lower insulated substrate 46 in the present embodiment is a DBC substrate. It should be noted that, as in the first lower insulated substrate 26 mentioned above, a specific configuration of the second lower insulated substrate 46 is not particularly limited, and various materials can be adopted for an insulator that constitutes the insulator layer 54, and for metal that constitutes each of the metal layers 56, 58. A bonding structure between the insulator layer 54 and each of the metal layers 56, 58 is not particularly limited either.

Figure 2:
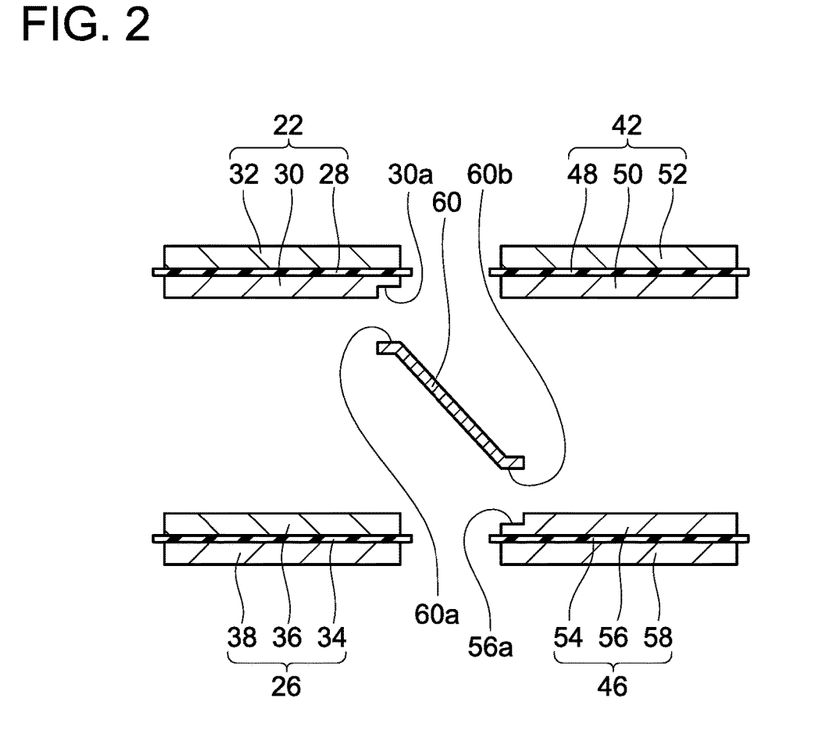
FIG. 2 is for describing a configuration relevant to a joint 60 in the first embodiment.

As illustrated in FIGS. 1 and 2, the semiconductor device 10 further includes the joint 60 constituted of a conductor. The joint 60 includes the first bonding part 60a to be bonded to the first upper insulated substrate 22, and the second bonding part 60b to be bonded to the second lower insulated substrate 46. The first bonding part 60a is positioned at one end of the joint 60, and the second bonding part 60b is positioned at the other end of the joint 60. The joint 60 is positioned within the sealant 70, and electrically connects the inner metal layer 30 of the first upper insulated substrate 22 and the inner metal layer 56 of the second lower insulated substrate 46. The first semiconductor element 20 and the second semiconductor element 40 are thereby connected in series via the joint 60. According to such a configuration, the joint 60 does not need to be disposed in advance in the first upper insulated substrate 22 and in the second lower insulated substrate 46. Accordingly, the joint 60 can be prepared independently as a separate member from the first upper insulated substrate 22 and the second lower insulated substrate 46. In a process of preparing the first upper insulated substrate 22 and the second lower insulated substrate 46, the joint 60 is thereby not influenced by high-temperature treatment, so that deformation of the joint 60 can be prevented. Here, as an example, the joint 60 can be constituted of copper.

As mentioned above, in the first embodiment, the recess parts 30a, 56a are provided in the inner metal layers 30, 56 of the first upper insulated substrate 22 and the second lower insulated substrate 46, respectively, which are to be bonded to the joint 60. Depths of these recess parts 30a, 56a (dimensions in thickness directions of the inner metal layers 30, 56) are not particularly limited. As an example, these recess parts 30a, 56a may be provided to have depths corresponding to a part of thicknesses of the inner metal layers 30, 56, respectively, and this enables easy positioning of the joint 60. The first bonding part 60a of the joint 60 is bonded to the recess part 30a in the inner metal layer 30 of the first upper insulated substrate 22 by soldering, and the second bonding part 60b of the joint 60 is bonded to the recess part 56a in the inner metal layer 56 of the second lower insulated substrate 46 by soldering. Both of the recess parts 30a, 56a provided in the inner metal layers 30, 56, respectively, are not necessarily needed, and only either one of the recess parts 30a, 56a has to be disposed. In this case as well, when the semiconductor device 10 is manufactured, the joint 60 can be bonded with high positional accuracy to at least one of the first upper insulated substrate 22 and the second lower insulated substrate 46.

Figure 3:
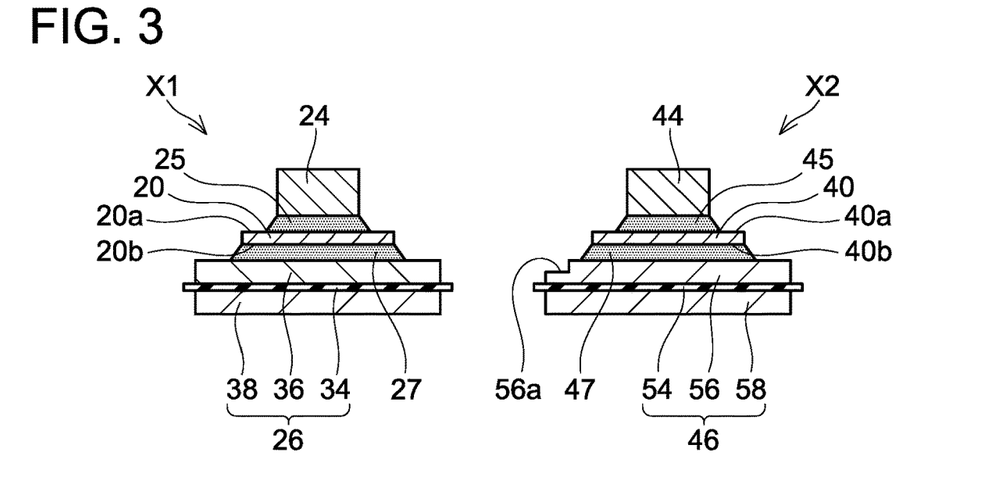
FIG. 3 is a diagram describing a method of manufacturing the semiconductor device 10, and illustrates an aspect in which a first semiconductor element 20 and a first conductor spacer 24 are stacked on a first lower insulated substrate 26 to provide a first stacked member X1, and a second semiconductor element 40 and a second conductor spacer 44 are stacked on a second lower insulated substrate 46 to provide a second stacked member X2.
Figure 4:
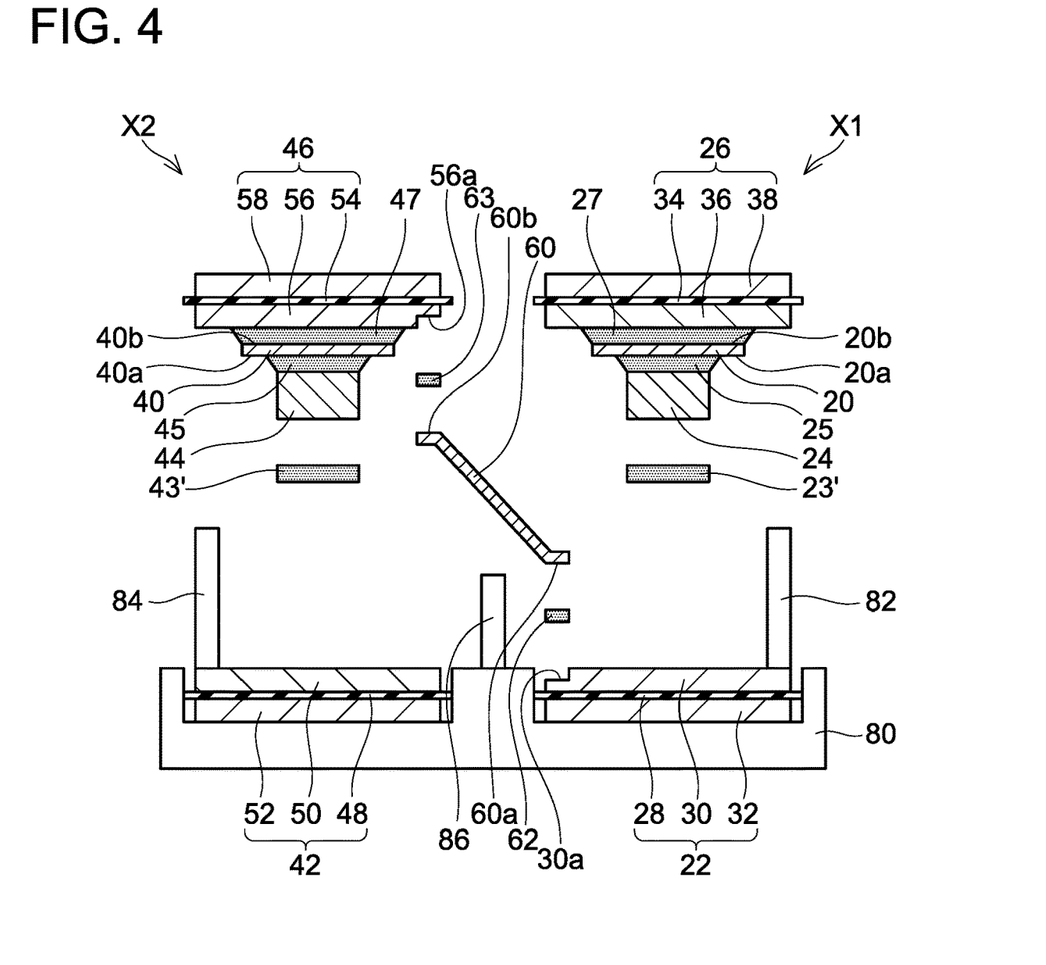
FIG. 4 is a diagram describing the method of manufacturing the semiconductor device 10, and illustrates an aspect in which the first stacked member X1 and the second stacked member X2 are reversed, and bonded onto a first upper insulated substrate 22 and a second upper insulated substrate 42, respectively, and the joint 60 is bonded to a predetermined bonding area.

With reference to FIGS. 3 and 4, a method of manufacturing the semiconductor device 10 in the first embodiment (here, a step of assembling each member) will be described. Initially, as illustrated in FIG. 3, the first lower insulated substrate 26 and the second lower insulated substrate 46 are prepared. Next, the first semiconductor element 20 and the first conductor spacer 24 are bonded, in this order, onto the inner metal layer 36 of the first lower insulated substrate 26 to provide a first stacked member X1. At this occasion, the inner metal layer 36 of the first lower insulated substrate 26 and the first semiconductor element 20 are bonded by the solder layer 27, and the first semiconductor element 20 and the first conductor spacer 24 are bonded by the solder layer 25. Similarly, the second semiconductor element 40 and the second conductor spacer 44 are bonded, in this order, onto the inner metal layer 56 of the second lower insulated substrate 46 to provide a second stacked member X2. At this occasion, the inner metal layer 56 of the second lower insulated substrate 46 and the second semiconductor element 40 are bonded by the solder layer 47, and the second semiconductor element 40 and the second conductor spacer 44 are bonded by the solder layer 45.

In the next step, as illustrated in FIG. 4, the first stacked member X1, the second stacked member X2, the first upper insulated substrate 22, the second upper insulated substrate 42, and the joint 60 are assembled at their predetermined positions, respectively. Initially, the first upper insulated substrate 22 and the second upper insulated substrate 42 are prepared, and are placed on a positioning jig 80 such that the inner metal layers 30, 50 of the first upper insulated substrate 22 (on the right in FIG. 4) and the second upper insulated substrate 42 (on the left in FIG. 4) are on an upper side, respectively. Next, the first stacked member X1, which has been formed in FIG. 3, is placed on the inner metal layer 30 of the first upper insulated substrate 22 via solder 23' with the first conductor spacer 24 on a lower side. Similarly, the second stacked member X2, which has been formed in FIG. 3, is placed on the inner metal layer 50 of the second upper insulated substrate 42 via solder 43' with the second conductor spacer 44 on a lower side. At this occasion, the first bonding part 60a of the joint 60 is placed on the recess part 30a in the inner metal layer 30 of the first upper insulated substrate 22 via solder 62. Similarly, the second bonding part 60b of the joint 60 is placed on the recess part 56a in the inner metal layer 56 of the second lower insulated substrate 46 via solder 63.

Here, as an example, height adjustment jigs 82, 84 for the first stacked member X1 and the second stacked member X2, respectively, may be installed on the inner metal layers 30, 50 of the first upper insulated substrate 22 and the second upper insulated substrate 42, respectively, to guide these members. Similarly, as an example, a height adjustment jig 86 for the joint 60 may also be installed on the positioning jig 80. This enables each member to be placed with high accuracy. Subsequently, the solder 23', 43', 62, 63 is molten by a reflow step for soldering, and assembly of the members is completed. Here, the solder to be used for soldering may be, as an example, sheet-like solder. With such a manufacturing method, in the process of preparing the first upper insulated substrate 22 and the second lower insulated substrate 46, the joint 60 is not influenced by high-temperature treatment, so that deformation of the joint 60 can be prevented. The semiconductor device 10 can be manufactured in a manufacturing step similar to the conventional manufacturing step, except for the steps above of manufacturing the semiconductor device 10.

Second Embodiment

Figure 5:
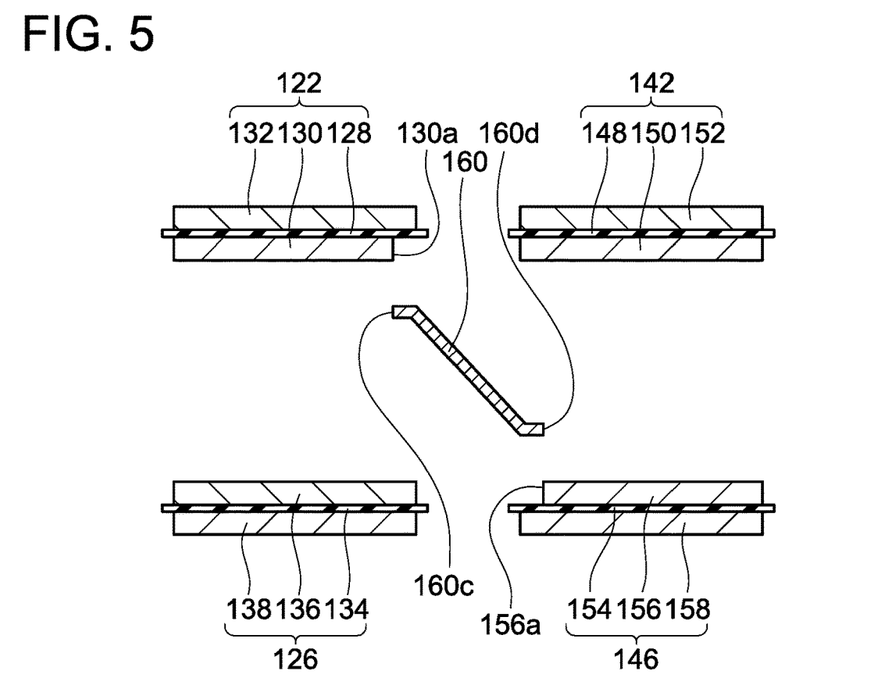
FIG. 5 shows a configuration relevant to a joint 160 in a second embodiment.

With reference to FIG. 5, a semiconductor device in a second embodiment will be described. The semiconductor device in the second embodiment differs from the semiconductor device 10 in the first embodiment only in a configuration relevant to a joint 160. Therefore, description will be made here only of the joint 160 and insulated substrates 122, 126, 142, 146 relating thereto. In the second embodiment, recess parts 130a, 156a in inner metal layers 130, 156 of the first upper insulated substrate 122 and the second lower insulated substrate 146, respectively, have shapes different from those in the first embodiment. Moreover, bonding parts 160c, 160d of the joint 160 are positioned at end faces of a joint 160, respectively, as to be mentioned below, and in this respect, the second embodiment differs from the first embodiment. Other configurations in the second embodiment are regarded as same as those in the first embodiment, and descriptions thereof will be omitted. The joint 160 has the first bonding part 160c to be bonded to the first upper insulated substrate 122 and the second bonding part 160d to be bonded to the second lower insulated substrate 146. The first bonding part 160c is positioned at one end of the joint 160, and the second bonding part 160d is positioned at the other end of the joint 160. The joint 160 electrically connects the inner metal layer 130 of the first upper insulated substrate 122 and the inner metal layer 156 of the second lower insulated substrate 146. According to such a configuration, the joint 160 does not need to be provided in advance at the first upper insulated substrate 122 and the second lower insulated substrate 146. Accordingly, the joint 160 can be prepared independently as a separate member from the first upper insulated substrate 122 and the second lower insulated substrate 146. In a process of preparing the first upper insulated substrate 122 and the second lower insulated substrate 146, the joint 160 is thereby not influenced by high-temperature treatment, so that deformation of the joint 160 can be prevented. Here, as an example, the joint 160 may be constituted of copper.

In the second embodiment, the recess parts 130a, 156a are provided in the inner metal layers 130, 156 of the first upper insulated substrate 122 and the second lower insulated substrate 146, respectively, which are to be bonded to the joint 160. As an example, these recess parts 130a, 156a may be provided to have depths corresponding to the entire thicknesses of the inner metal layers 130, 156, and reach insulator layers 128, 154, respectively. According to such a configuration, in the process of manufacturing the insulated substrates 122, 146, the recess parts 130a, 156a are easily formed in the inner metal layers 130, 156 that have yet to be bonded to the insulator layers 128, 154, respectively. The first bonding part 160c of the joint 160 is bonded to the recess part 130a in the inner metal layer 130 of the first upper insulated substrate 122 by soldering. Similarly, the second bonding part 160d of the joint 160 is bonded to the recess part 156a in the inner metal layer 156 of the second lower insulated substrate 146 by soldering. Here, since the recess parts 130a, 156a have such thicknesses as to reach the insulator layers 128, 154, respectively, the bonding parts 160c, 160d are provided at the end faces of the joint 160. Both of the recess parts 130a, 156a disposed in the inner metal layers 130, 156, respectively, are not necessarily needed, and either one of the recess parts 130a, 156a only has to be disposed. In this case as well, when the semiconductor device is manufactured, the joint 160 can be bonded with high positional accuracy to at least one of the first upper insulated substrate 122 and the second lower insulated substrate 146.

Third Embodiment

Figure 6:
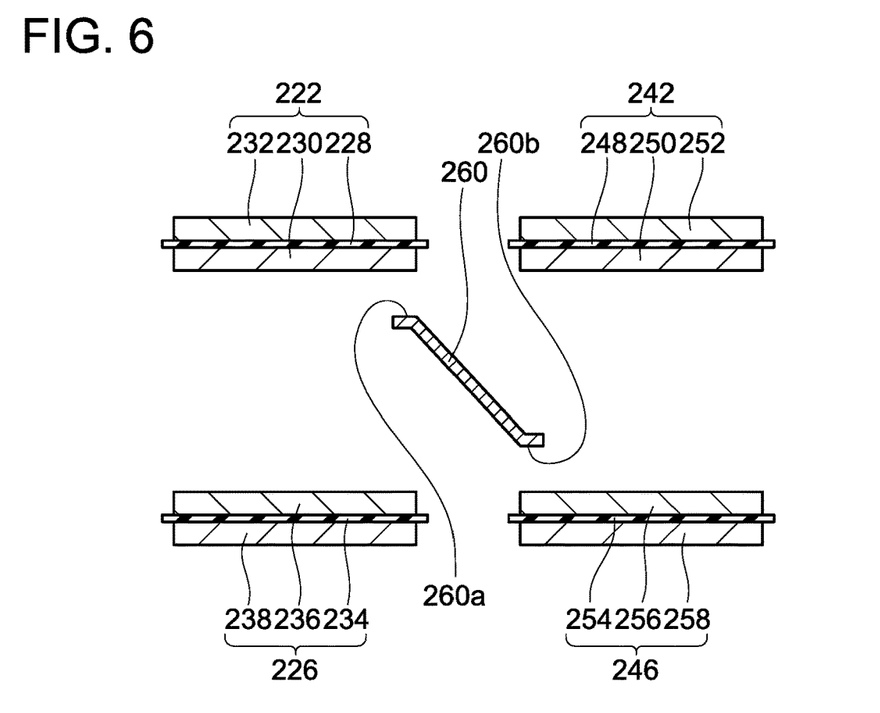
FIG. 6 shows a configuration relevant to a joint 260 in a third embodiment.

With reference to FIG. 6, a semiconductor device in a third embodiment will be described. The semiconductor device in the third embodiment differs from the semiconductor device 10 in the first embodiment only in a configuration relevant to a joint 260. Therefore, descriptions will be made here only of the joint 260 and insulated substrates 222, 226, 242, 246 relating thereto. In the second embodiment, no recess part is formed in inner metal layers 230, 256 of the first upper insulated substrate 222 and the second lower insulated substrate 246. In this respect, the third embodiment differs from the first embodiment. Other configurations in the third embodiment are regarded as equivalent to those in the first embodiment, and description thereof will be omitted. The joint 260 includes a first bonding part 260a to be bonded to the first upper insulated substrate 222 and a second bonding part 260b to be bonded to the second lower insulated substrate 246. The first bonding part 260a is positioned at one end of the joint 260, and the second bonding part 260b is positioned at the other end of the joint 260. The joint 260 electrically connects the inner metal layer 230 of the first upper insulated substrate 222 and the inner metal layer 256 of the second lower insulated substrate 246. According to such a configuration, the joint 260 does not need to be provided in advance at the first upper insulated substrate 222 and the second lower insulated substrate 246. Accordingly, the joint 260 can be prepared independently as a separate member from the first upper insulated substrate 222 and the second lower insulated substrate 246. In a process of preparing the first upper insulated substrate 222 and the second lower insulated substrate 246, the joint 260 is thereby not influenced by high-temperature treatment, so that deformation of the joint 260 can be prevented. Here, as an example, the joint 260 may be constituted of copper.

Fourth Embodiment

Figure 7:
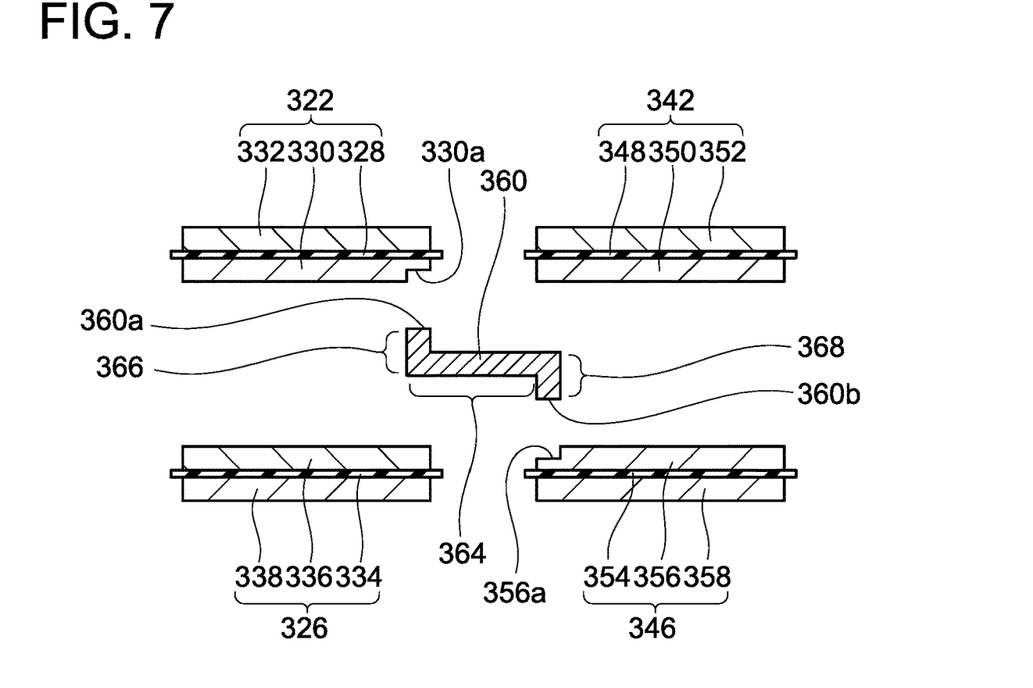
FIG. 7 shows a configuration relevant to a joint 360 in a fourth embodiment.

With reference to FIG. 7, a semiconductor device in a fourth embodiment will be described. The semiconductor device in the fourth embodiment differs from the semiconductor device 10 in the first embodiment 1 only in a configuration relevant to a joint 360. Therefore, descriptions will be made here only of the joint 360 and insulated substrates 322, 326, 342, 346 relating thereto. In the fourth embodiment, the joint 360 has a shape different from that in the first embodiment. The joint 360 includes a horizontal part 364 parallel to the insulated substrates 322, 326, 342, 346, and perpendicular parts 366, 368 perpendicular to the insulated substrates 322, 326, 342, 346. Other configurations in the fourth embodiment are regarded as equivalent to those in the first embodiment, and descriptions thereof will be omitted. The joint 360 includes a first bonding part 360a to be bonded to the first upper insulated substrate 322, and a second bonding part 360b to be bonded to the second lower insulated substrate 346. The first bonding part 360a is positioned at one end of the joint 360, and the second bonding part 360b is positioned at the other end of the joint 360. The joint 360 electrically connects an inner metal layer 330 of the first upper insulated substrate 322 and an inner metal layer 356 of the second lower insulated substrate 346. According to such a configuration, the joint 360 does not need to be provided in advance at the first upper insulated substrate 322 and the second lower insulated substrate 346. Accordingly, the joint 360 can be prepared independently as a separate member from the first upper insulated substrate 322 and the second lower insulated substrate 346. In a process of preparing the first upper insulated substrate 322 and the second lower insulated substrate 346, the joint 360 is thereby not influenced by high-temperature treatment, so that deformation of the joint 360 can be prevented. Here, as an example, the joint 360 may be constituted of copper.

In the fourth embodiment, recess parts 330a, 356a are provided in the inner metal layers 330, 356 of the first upper insulated substrate 322 and the second lower insulated substrate 346, respectively, which are to be bonded to the joint 360. Depths of these recess parts 330a, 356a (dimensions in thickness directions of the inner metal layers 330, 356) are not particularly limited. As an example, these recess parts 330a, 356a only need to be provided to have depths corresponding to a part of thicknesses of the inner metal layers 330, 356, respectively, and this enables easy positioning of the joint 360. The first bonding part 360a of the joint 360 is bonded to the recess part 330a in the inner metal layer 330 of the first upper insulated substrate 322 by soldering, and the second bonding part 360b of the joint 360 is bonded to the recess part 356a in the inner metal layer 356 of the second lower insulated substrate 346 by soldering. Both of the recess parts 330a, 356a provided in the inner metal layers 330, 356, respectively, are not necessarily needed, and either one of the recess parts 330a, 356a only has to be provided. In this case as well, when the semiconductor device is manufactured, the joint 360 can be bonded with high positional precision to at least one of the first upper insulated substrate 322 and the second lower insulated substrate 346.

Moreover, the joint 360 in the fourth embodiment includes the horizontal part 364 parallel to the insulated substrates 322, 326, 342, 346, and the perpendicular parts 366, 368 perpendicular to the insulated substrates 322, 326, 342, 346. The joint 360 can thereby easily be fixed by a jig, and easy positioning of the joint 360 can be achieved.

Fifth Embodiment

Figure 8:
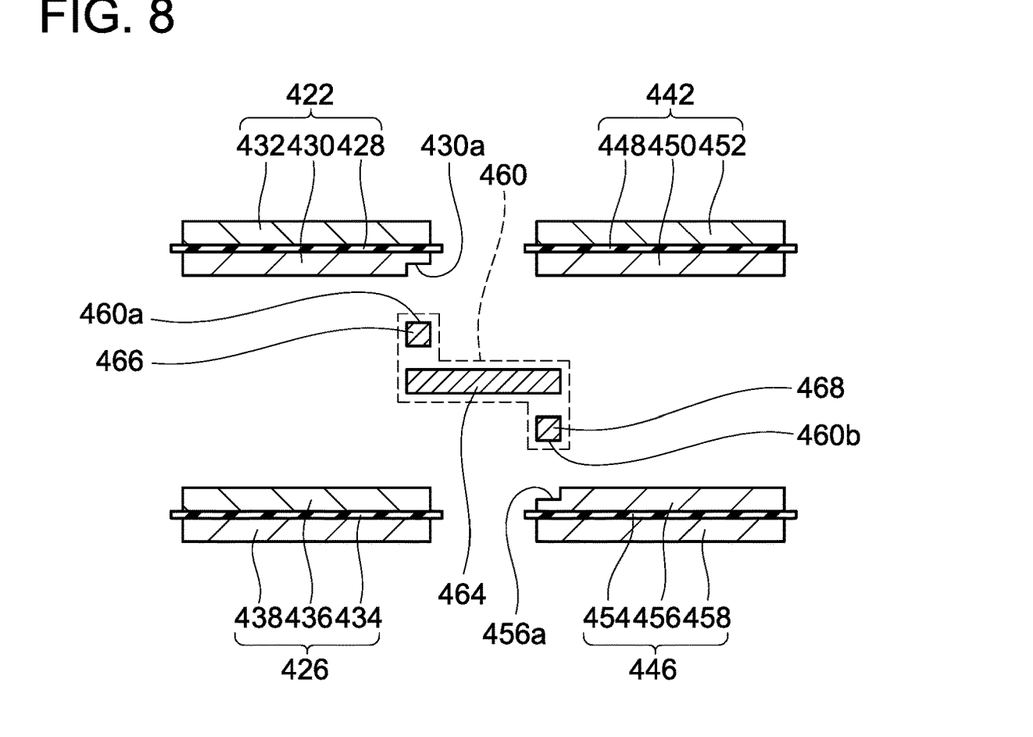
FIG. 8 shows a configuration relevant to a joint 460 in a fifth embodiment.

With reference to FIG. 8, a semiconductor device in a fifth embodiment will be described. The semiconductor device in the fifth embodiment differs from the semiconductor device in the first embodiment only in a configuration relevant to a joint 460. Therefore, descriptions will be made here only of the joint 460 and insulated substrates 422, 426, 442, 446 relating thereto. In the fifth embodiment, a method of fabricating the joint 460 differs from that in the first embodiment. As in the fourth embodiment, the joint 460 includes a horizontal part 464 parallel to the insulated substrates 422, 426, 442, 446, and perpendicular parts 466, 468 perpendicular to the insulated substrates 422, 426, 442, 446. Furthermore, the joint 460 may be constituted of members 464, 466, 468, which are obtained by dividing the joint 460, and the members 464, 466, 468 may be bonded by soldering to eventually provide the joint 460 in an integral form. Other configurations in Embodiment 5 are regarded as equivalent to those in Embodiment 1, and description thereof will be omitted. The joint 460 includes a first bonding part 460a to be bonded to the first upper insulated substrate 422, and a second bonding part 460b to be bonded to the second lower insulated substrate 446. The first bonding part 460a is positioned at one end of the joint 460, and the second bonding part 460b is positioned at the other end of the joint 460. The joint 460 electrically connects an inner metal layer 430 of the first upper insulated substrate 422 and an inner metal layer 456 of the second lower insulated substrate 446. According to such a configuration, the joint 460 does not need to be provided in advance in the first upper insulated substrate 422 and the second lower insulated substrate 446. Accordingly, the joint 460 can be prepared independently as a separate member from the first upper insulated substrate 422 and the second lower insulated substrate 446. In a process of preparing the first upper insulated substrate 422 and the second lower insulated substrate 446, the joint 460 is thereby not influenced by high-temperature treatment, so that deformation of the joint 460 can be prevented. Here, as an example, the joint 460 may be constituted of copper.

In the fifth embodiment, recess parts 430a, 456a are provided in the inner metal layers 430, 456 of the first upper insulated substrate 422 and the second lower insulated substrate 446, respectively, which are to be bonded to the joint 460. Depths of these recess parts 430a, 456a (dimensions in thickness directions of the inner metal layers 430, 456) are not particularly limited. As an example, these recess parts 430a, 456a may be formed to have depths corresponding to a part of thicknesses of the inner metal layers 430, 456, respectively, and this enables easy positioning of the joint 460. The first bonding part 460a of the joint 460 is bonded to the recess part 430a in the inner metal layer 430 of the first upper insulated substrate 422 by soldering, and the second bonding part 460b of the joint 460 is bonded to the recess part 456a in the inner metal layer 456 of the second lower insulated substrate 446 by soldering. Both of the recess parts 430a, 456a provided in the inner metal layers 430, 456, respectively, are not necessarily needed, and either one of the recess parts 430a, 456a only has to be disposed. In this case as well, when the semiconductor device is manufactured, the joint 460 can be bonded with high positional precision to at least one of the first upper insulated substrate 422 and the second lower insulated substrate 446.

Moreover, the joint 460 in the fifth embodiment includes the horizontal part 464 parallel to the insulated substrates 422, 426, 442, 446 and the perpendicular parts 466, 468 perpendicular to the insulated substrates 422, 426, 442, 446. Furthermore, the joint 460 may be constituted of the members 464, 466, 468, which are obtained by dividing the joint 460, and the members 464, 466, 468 may be bonded by soldering to eventually provide the joint 460 in an integral form. The joint 460 can thereby be manufactured easily. Moreover, the joint 460 can easily be fixed by a jig, and easy positioning of the joint 460 can be achieved.

Sixth Embodiment

Figure 9:
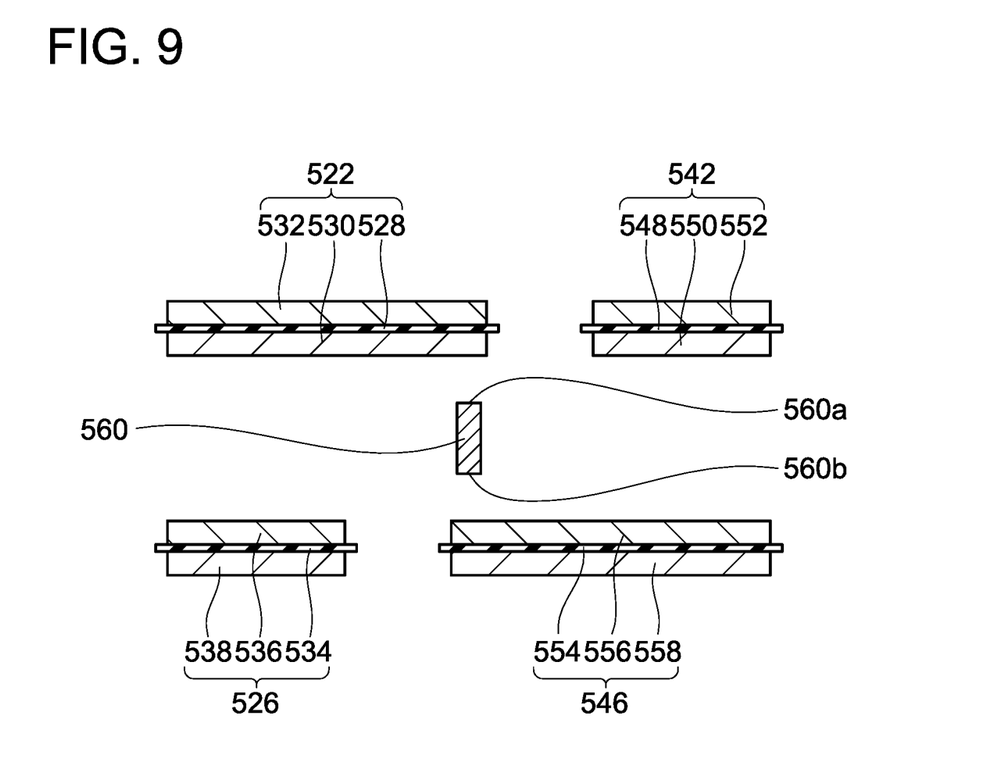
FIG. 9 shows a configuration relevant to a joint 560 in a sixth embodiment.

With reference to FIG. 9, a semiconductor device in a sixth embodiment will be described. The semiconductor device in the sixth embodiment differs from the semiconductor device 10 in the first embodiment only in a configuration relevant to a joint 560. Therefore, descriptions will be made here only of configurations of the joint 560 and insulated substrates 522, 526, 542, 546 relating thereto. In the sixth embodiment, the first upper insulated substrate 522 and the second lower insulated substrate 546 are placed such that a part of an inner metal layer 530 is opposed to a part of an inner metal layer 556. Moreover, in the sixth embodiment, no recess part is provided in the inner metal layers 530, 556 of the first upper insulated substrate 522 and the second lower insulated substrate 546, respectively. In these respects, the sixth embodiment differs from the first embodiment. It should be noted that the presence or absence of recess parts in the inner metal layers 530, 556 of the first upper insulated substrate 522 and the second lower insulated substrate 546, respectively, is not particularly limited, and as in the first embodiment, recess parts may be provided in the inner metal layers 530, 556 of the first upper insulated substrate 522 and the second lower insulated substrate 546, respectively. Depths of the recess parts in this case (dimensions in thickness directions of the inner metal layers 530, 556) are not particularly limited either. Other configurations in the sixth embodiment are regarded as equivalent to those in the first embodiment, and descriptions thereof will be omitted. The joint 560 includes a first bonding part 560a to be bonded to the first upper insulated substrate 522, and a second bonding part 560b to be bonded to the second lower insulated substrate 546. The first bonding part 560a is positioned at one end of the joint 560, and the second bonding part 560b is positioned at the other end of the joint 560. The joint 560 electrically connects the inner metal layer 530 of the first upper insulated substrate 522 and the inner metal layer 556 of the second lower insulated substrate 546. According to such a configuration, the joint 560 does not need to be provided in advance at the first upper insulated substrate 522 and the second lower insulated substrate 546. Accordingly, the joint 560 can be prepared independently as a separate member from the first upper insulated substrate 522 and the second lower insulated substrate 546. In a process of preparing the first upper insulated substrate 522 and the second lower insulated substrate 546, the joint 560 is thereby not influenced by high-temperature treatment, so that deformation of the joint 560 can be prevented. Here, as an example, the joint 560 may be constituted of copper.

Moreover, in the sixth embodiment, the first upper insulated substrate 522 and the second lower insulated substrate 546 are placed such that a part of the inner metal layer 530 is opposed to a part of the inner metal layer 556. The joint 560 can thereby be connected vertically between the inner metal layer 530 of the first upper insulated substrate 522 and the inner metal layer 556 of the second lower insulated substrate 546, so that the joint 560 can be bonded easily to the first upper insulated substrate 522 and the second lower insulated substrate 546. Furthermore, the joint 560 has a simpler shape than that in the first embodiment, so that the joint 560 can be manufactured easily.

What is claimed is:

1. A semiconductor device comprising:
   a first semiconductor element and a second semiconductor element;
   a first insulated substrate comprising an insulator layer and a metal layer disposed on each of two faces of the insulator layer, the metal layer on one face of the first insulated substrate being connected to the first semiconductor element; and
   a second insulated substrate comprising an insulator layer and a metal layer disposed on each of two faces of the insulator layer, the metal layer on one face of the second insulated substrate being connected to the second semiconductor element,
   wherein
   the metal layer on the one face of the first insulated substrate is electrically connected to the metal layer on the one face of the second insulated substrate via a joint;
   the joint is constituted of a separate member from the first insulated substrate and the second insulated substrate; and
   one end of the joint is attached to the metal layer on the one face of the first insulated substrate, and another end of the joint is attached to the metal layer on the one face of the second insulated substrate.

2. The semiconductor device according to claim 1, wherein
   a recess part is provided in the metal layer on the one face of at least one of the first insulated substrate and the second insulated substrate, and the one or the other end of the joint is connected to the recess part.

3. The semiconductor device according to claim 2, wherein
   the recess part of the first insulated substrate has a depth smaller than a thickness of the metal layer on the one face of the first insulated substrate, and/or
   the recess part of the second insulated substrate has a depth smaller than a thickness of the metal layer on the one face of the second insulated substrate.

4. The semiconductor device according to claim 1, wherein
   at least a part of the metal layer on the one face of the first insulated substrate is opposed to at least a part of the metal layer on the one face of the second insulated substrate.

5. A method of manufacturing the semiconductor device according to claim 1, the method comprising:
   preparing the first insulated substrate, the second insulated substrate, and the joint respectively; and
   bonding the one end of the joint to the metal layer on the one face of the first insulated substrate, and bonding the other end of the joint to the metal layer on the one face of the second insulated substrate.

6. The semiconductor device according to claim 1, wherein
   the one end of the joint is bonded to the metal layer on the one face of the first insulated substrate via solder, and
   the other end of the joint is bonded to the metal layer on the one face of the second insulated substrate via solder.

7. The semiconductor device according to claim 1, the semiconductor device further comprising:
   a third insulated substrate opposed to the first insulated substrate with the first semiconductor element interposed therebetween; and
   a fourth insulated substrate opposed to the second insulated substrate with the second semiconductor element interposed therebetween,
   wherein
   the third insulated substrate comprises an insulator layer and a metal layer disposed on each of two faces of the insulator layer, the metal layer on one face of the third insulated substrate being connected to the first semiconductor element; and
   the fourth insulated substrate comprises an insulator layer and a metal layer disposed on each of two faces of the insulator layer, the metal layer on one face of the fourth insulated substrate being connected to the second semiconductor element.

8. The semiconductor device according to claim 7, the semiconductor device further comprising an encapsulant that encapsulates the first semiconductor element and the second semiconductor element,
   wherein
   the encapsulant comprises a first surface and a second surface located opposite the first surface,
   the metal layer on another face of the first insulated substrate and the metal layer on another face of the fourth insulated substrate are exposed at the first surface of the encapsulant, and
   the metal layer on another face of the second insulated substrate and the metal layer on another face of the third insulated substrate are exposed at the second surface of the encapsulant.

9. A semiconductor device comprising:
   a first semiconductor element and a second semiconductor element, the first semiconductor element and the second semiconductor element each including an electrode;
   a first insulated substrate comprising an insulator layer and a metal layer disposed on each of two faces of the insulator layer, the metal layer on one face of the first insulated substrate being connected to the first semiconductor element; and
   a second insulated substrate comprising an insulator layer and a metal layer disposed on each of two faces of the insulator layer, the metal layer on one face of the second insulated substrate being connected to the second semiconductor element,
   wherein
   the metal layer on the one face of the first insulated substrate is electrically connected to the metal layer on the one face of the second insulated substrate via a joint;
   the joint is constituted of a separate member from the first insulated substrate and the second insulated substrate; and one end of the joint is connected to the metal layer on the one face of the first insulated substrate, and another end of the joint is connected to the metal layer on the one face of the second insulated substrate.

10. The semiconductor device according to claim 9, wherein
a recess part is provided in the metal layer on the one face of at least one of the first insulated substrate and the second insulated substrate, and the one or the other end of the joint is connected to the recess part.

11. The semiconductor device according to claim 10, wherein
the recess part of the first insulated substrate has a depth smaller than a thickness of the metal layer on the one face of the first insulated substrate, and/or
the recess part of the second insulated substrate has a depth smaller than a thickness of the metal layer on the one face of the second insulated substrate.

12. The semiconductor device according to claim 9, wherein
at least a part of the metal layer on the one face of the first insulated substrate is opposed to at least a part of the metal layer on the one face of the second insulated substrate.

13. A method of manufacturing the semiconductor device according to claim 9, the method comprising:
preparing the first insulated substrate, the second insulated substrate, and the joint respectively; and
bonding the one end of the joint to the metal layer on the one face of the first insulated substrate, and bonding the other end of the joint to the metal layer on the one face of the second insulated substrate.

14. The semiconductor device according to claim 9, wherein
the one end of the joint is bonded to the metal layer on the one face of the first insulated substrate via solder, and the other end of the joint is bonded to the metal layer on the one face of the second insulated substrate via solder.

15. The semiconductor device according to claim 9, the semiconductor device further comprising:
a third insulated substrate opposed to the first insulated substrate with the first semiconductor element interposed therebetween; and
a fourth insulated substrate opposed to the second insulated substrate with the second semiconductor element interposed therebetween,
wherein
the third insulated substrate comprises an insulator layer and a metal layer disposed on each of two faces of the insulator layer, the metal layer on one face of the third insulated substrate being connected to the first semiconductor element; and
the fourth insulated substrate comprises an insulator layer and a metal layer disposed on each of two faces of the insulator layer, the metal layer on one face of the fourth insulated substrate being connected to the second semiconductor element.

16. The semiconductor device according to claim 15, the semiconductor device further comprising an encapsulant that encapsulates the first semiconductor element and the second semiconductor element,
wherein
the encapsulant comprises a first surface and a second surface located opposite the first surface,
the metal layer on another face of the first insulated substrate and the metal layer on another face of the fourth insulated substrate are exposed at the first surface of the encapsulant, and
the metal layer on another face of the second insulated substrate and the metal layer on another face of the third insulated substrate are exposed at the second surface of the encapsulant.

* * * * *